(12) United States Patent
Sundaram et al.

(10) Patent No.: US 10,719,237 B2
(45) Date of Patent: Jul. 21, 2020

(54) APPARATUSES AND METHODS FOR CONCURRENTLY ACCESSING MULTIPLE PARTITIONS OF A NON-VOLATILE MEMORY

(71) Applicant: Micron Technology, Inc., Boise, ID (US)

(72) Inventors: Rajesh Sundaram, Folsom, CA (US); Derchang Kau, Cupertino, CA (US); Owen W. Jungroth, Sonora, CA (US); Daniel Chu, Folsom, CA (US); Raymond W. Zeng, Sunnyvale, CA (US); Shekoufeh Qawami, El Dorado Hills, CA (US)

(73) Assignee: Micron Technology, Inc., Boise, ID (US)

(*) Notice: Subject to any disclaimer, the term of this patent is extended or adjusted under 35 U.S.C. 154(b) by 106 days.

(21) Appl. No.: 14/992,979

(22) Filed: Jan. 11, 2016

(65) Prior Publication Data
US 2017/0199666 A1 Jul. 13, 2017

(51) Int. Cl.
*G06F 3/06* (2006.01)
*G11C 8/12* (2006.01)
(Continued)

(52) U.S. Cl.
CPC ............ *G06F 3/061* (2013.01); *G06F 3/0644* (2013.01); *G06F 3/0656* (2013.01);
(Continued)

(58) Field of Classification Search
None
See application file for complete search history.

(56) References Cited

U.S. PATENT DOCUMENTS 5,822,251 A * 10/1998 Bruce ................. G06F 11/1068
365/185.33
6,950,337 B2 9/2005 Bellini et al.
(Continued)

FOREIGN PATENT DOCUMENTS

JP   2013109823 A   6/2013
WO  2007036050 A1  4/2007
(Continued)

OTHER PUBLICATIONS

Receipt of ISR/WO dated Apr. 3, 2017 for appln No. PCT/US2016/068834.
(Continued)

*Primary Examiner* — Charles Rones
*Assistant Examiner* — Hewy H Li
(74) *Attorney, Agent, or Firm* — Dorsey & Whitney LLP

(57) ABSTRACT

Apparatuses and methods for performing multithread, concurrent access of different partition of a memory are disclosed herein. An example apparatus may include a non-volatile memory array comprising a plurality of partitions. Each of the plurality of partitions may include a respective plurality of memory cells. The apparatus may further include a plurality of local controllers that are each configured to independently and concurrently access a respective one of the plurality of partitions to execute a respective memory access command of a plurality of memory access commands responsive to receiving the respective memory access command. The example apparatus may further include a controller configured to receive the plurality of memory access commands and to determine a respective target partition of the plurality of partitions for each of the plurality of memory access commands. The controller may be further configured to provide each of the plurality of memory access commands
(Continued)

400

| Timing Parameter | | Rule |
|---|---|---|
| Read to Read → Same Partition | | Time X1 (ns) |
| Read to Read → Different Partition | | Time X2 (ns) |
| Write to Write → Same Partition | | Time X3 (ns) |
| Write to Write → Different Partition | | Time X4 (ns) |
| Read to Write → Same Partition | | Time X5 (ns) |
| Read to Write → Different Partition | | Time X6 (ns) |
| Write to Read → Same Partition | | Time X7 (ns) |
| Write to Read → Different Partition | | Time X8 (ns) | to a local controller of the plurality of local controllers associated with the respective target partition.

24 Claims, 4 Drawing Sheets

(51) Int. Cl.
  *G11C 7/10* (2006.01)
  *G11C 16/08* (2006.01)
(52) U.S. Cl.
  CPC .......... *G06F 3/0659* (2013.01); *G06F 3/0679* (2013.01); *G06F 3/0688* (2013.01); *G11C 7/1042* (2013.01); *G11C 7/1045* (2013.01); *G11C 8/12* (2013.01); *G11C 16/08* (2013.01)

(56) References Cited

U.S. PATENT DOCUMENTS

| | | | | |
|---|---|---|---|---|
| 7,024,514 | B2* | 4/2006 | Mukaida | G06F 12/0246 |
| | | | | 711/103 |
| 9,293,188 | B2* | 3/2016 | Brandl | G11C 11/4087 |
| 2002/0105844 | A1* | 8/2002 | Leung | G11C 7/22 |
| | | | | 365/222 |
| 2002/0138686 | A1* | 9/2002 | Yang | G06F 13/1689 |
| | | | | 711/105 |
| 2002/0194451 | A1 | 12/2002 | Mukaida et al. | |
| 2003/0062938 | A1 | 4/2003 | Piersimoni et al. | |
| 2003/0123318 | A1* | 7/2003 | Nagashima | G11C 7/1042 |
| | | | | 365/233.1 |
| 2005/0081013 | A1 | 4/2005 | Pekny et al. | |
| 2005/0286506 | A1* | 12/2005 | LaBerge | G06F 13/1684 |
| | | | | 370/363 |
| 2008/0147968 | A1* | 6/2008 | Lee | G11C 5/04 |
| | | | | 711/103 |
| 2009/0089517 | A1* | 4/2009 | Imai | G06F 13/1689 |
| | | | | 711/154 |
| 2009/0196116 | A1* | 8/2009 | Oh | G11C 8/12 |
| | | | | 365/230.03 |
| 2010/0211737 | A1 | 8/2010 | Flynn et al. | |
| 2013/0121075 | A1* | 5/2013 | Hutchison | G11C 11/5628 |
| | | | | 365/185.11 |
| 2013/0121086 | A1 | 5/2013 | Terzioglu et al. | |
| 2013/0238848 | A1* | 9/2013 | Garrett, Jr. | G11C 7/1042 |
| | | | | 711/105 |
| 2014/0229702 | A1 | 8/2014 | Porzio et al. | |
| 2014/0289446 | A1* | 9/2014 | Takizawa | G11C 5/025 |
| | | | | 711/102 |
| 2015/0036430 | A1* | 2/2015 | Sukegawa | G11C 16/10 |
| | | | | 365/185.11 |
| 2015/0348627 | A1* | 12/2015 | Taub | G11C 13/0004 |
| | | | | 365/163 |
| 2015/0370630 | A1* | 12/2015 | Yang | G06F 11/1044 |
| | | | | 711/103 |
| 2016/0141013 | A1* | 5/2016 | Lin | G06F 13/1689 |
| | | | | 365/193 |
| 2017/0148514 | A1* | 5/2017 | Lee | G11C 13/0069 |

FOREIGN PATENT DOCUMENTS

| | | |
|---|---|---|
| WO | 2010147827 A1 | 12/2010 |
| WO | 2015025357 A1 | 2/2015 |
| WO | 2016025173 A1 | 2/2016 |

OTHER PUBLICATIONS

"Flash memory", From Wikipedia; https://en.wikipedia.org/wiki/Flash_memory; Accessed on Jan. 11, 2016,.
"Jedec Standard", Embedded Multi-Media Card (e•MMC) Electrical Standard (5.1) JESD84-B51 Feb. 2015.
"Micron StrataFlash Embedded Memory—Data Sheet", Micron Technology, Inc. Rev. I May 2015 EN.
"Parallel NOR Flash Automotive Memory—Data Sheet", Micron Technology Inc., Rev. D Sep. 2015 EN.
First Office Action dated Sep. 6, 2017 for Taiwan Application No. 106100884.
English translation of JP Office Action dated Nov. 5, 2019 for JP Application No. 2018-535296, 9 pgs.
Extended European Search Report dated Aug. 2, 2019 for European Patent Application No. 16885432.1, 12 pages.
English Translation of First Office Action dated Aug. 23, 2019 for Korean application No. 10-2018-7023018, pp all.
KR Office Action dated Apr. 17, 2020 for KR Application No. 10-2018-7023018, 7 pgs.

\* cited by examiner

| Timing Parameter | | Rule |
|---|---|---|
| Read to Read → Same Partition | | Time X1 (ns) |
| Read to Read → Different Partition | | Time X2 (ns) |
| Write to Write → Same Partition | | Time X3 (ns) |
| Write to Write → Different Partition | | Time X4 (ns) |
| Read to Write → Same Partition | | Time X5 (ns) |
| Read to Write → Different Partition | | Time X6 (ns) |
| Write to Read → Same Partition | | Time X7 (ns) |
| Write to Read → Different Partition | | Time X8 (ns) |

FIG. 4

APPARATUSES AND METHODS FOR CONCURRENTLY ACCESSING MULTIPLE PARTITIONS OF A NON-VOLATILE MEMORY

BACKGROUND

Memories may be provided in a variety of apparatuses, such as computers or other devices, including but not limited to portable storage devices, solid state drives, music players, cameras, phones, wireless devices, displays, chip sets, set top boxes, gaming systems, vehicles, and appliances. There are many different types of memory including volatile memory (e.g., dynamic random access memory (DRAM)) and non-volatile memory (e.g., flash memory, phase change memory, etc.).

In non-volatile memories, memory arrays may be divided into partitions. Dividing a memory into partitions may break up rows or columns into smaller sections for accessing during memory access operations. However, current memory architectures may allow access to only a single partition of the memory at a time.

BRIEF DESCRIPTION OF THE DRAWINGS

FIG. 4 is a separation timing rule lookup table according to an embodiment of the present disclosure.

DETAILED DESCRIPTION

Apparatuses and methods for multithread, concurrent access of multiple partitions of a memory are disclosed herein. Certain details are set forth below to provide a sufficient understanding of embodiments of the disclosure. However, it will be clear to one having skill in the art that embodiments of the disclosure may be practiced without these particular details. Moreover, the particular embodiments of the present disclosure described herein are provided by way of example and should not be used to limit the scope of the disclosure to these particular embodiments. In other instances, well-known circuits, control signals, timing protocols, and software operations have not been shown in detail in order to avoid unnecessarily obscuring the disclosure.

Figure 1:
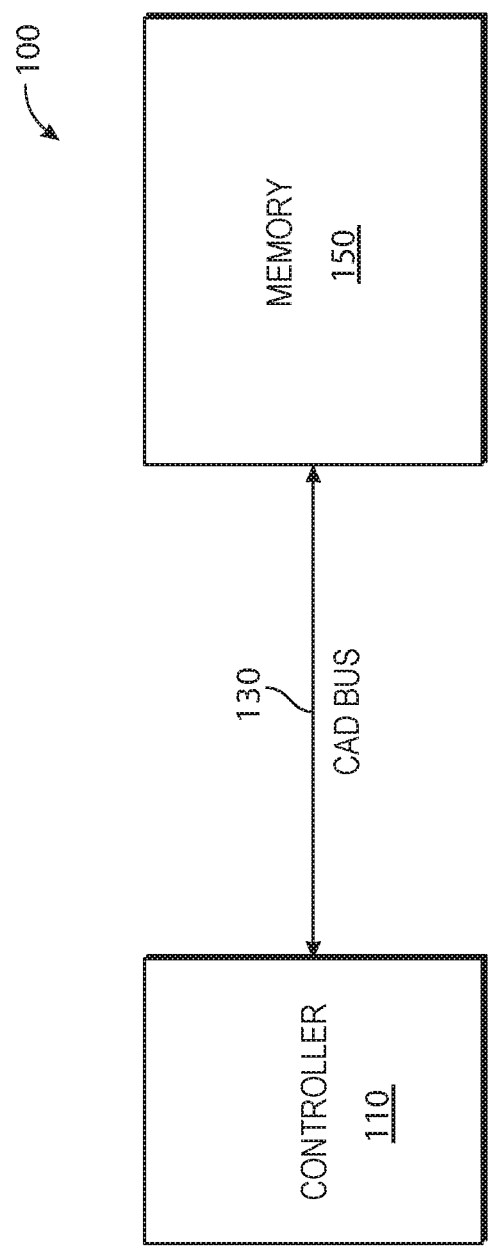
FIG. 1 is a block diagram of an apparatus including a memory according to an embodiment of the present disclosure.

FIG. 1 is a block diagram of an apparatus 100 (e.g., an integrated circuit, a memory device, a memory system, an electronic device or system, a smart phone, a tablet, a computer, a server, etc) including a memory 150 according to an embodiment of the present disclosure. The memory 150 is configured to perform multithread, concurrent access of multiple partitions. The apparatus 100 may include a controller 110 coupled to a memory 150 via a command, address, and data (CAD) bus 130. The memory 150 may be configured to receive commands and/or addresses from the controller 110 over the CAD bus 130, and the memory may be configured to receive data and/or provide data over the CAD bus 130.

In some examples, the memory 150 may be a non-volatile memory. Examples of non-volatile memory include NAND flash, NOR flash, PCM, PCMS, 3D cross point memory, PRAM, stacked memory, OUM, OUMS, etc. The memory 150 may include an array of cells organized across multiple memory partitions. The memory partitions may be divided into blocks, with each block having multiple memory cell pages. Each page may include memory cells that are coupled to access lines. The memory 150 may be configured to perform multithread, concurrent access of two or more partitions. The memory 150 may include control circuitry (e.g., local controllers and data buffers) that is configured to independently access individual partitions concurrently. For example, the memory 150 may include an internal controller that receives memory access commands (e.g., command, address, and data information) from the CAD bus 130, and provides the command and address information to a local controller associated with a target partition. The local controller may also send the data associated with the memory access command to a data buffer associated with the target partition. The internal controller may be configured to initiate the memory access command while a previously received memory access command continues to be executed. Thus, memory access commands may be executed in two or more different partitions concurrently.

Typically, a memory must complete processing of a memory access command prior to processing a subsequent memory access command. As previously discussed, the memory 150 may be divided into multiple partitions with associated control circuitry (e.g., local controllers and data buffers). Thus, during operation, the memory 150 may be configured to receive and concurrently process multiple memory access command threads from the controller 110 by leveraging the multiple partitions and control circuitry. For example, the controller 110 may provide a first memory access command (e.g., first command, first address, and/or first data) directed to a first partition of the memory 150 via the CAD bus 130. The first memory access command may include a read command and address, a write command, address, and write data, or other memory access command, for example. The memory 150 may receive and begin processing the first memory access command. As the first memory command is being processed at the first partition of the memory 150, the controller 110 may issue a second memory access command directed to a second partition of the memory 150 via the CAD bus 130. The memory 150 may begin processing the second memory access command at the second partition concurrently with processing of the first memory access command by the first partition.

The internal controller of the memory 150 may determine a target partition of the memory 150 and provide the memory access command information to the control circuitry associated with the target partition. In some embodiments, the internal controller of the memory 150 may use the address associated with the first memory access command to determine the target partition. Thus, in an example, the internal controller may provide the first memory access command to a first local controller associated with the first partition to execute the first memory access command. Further, the internal controller may provide the second memory access command to a second local controller associated with the second partition to execute the second memory access command. If either or both of the first or second memory access commands are write commands, the internal controller may provide associated data to the first or second data buffer, respectively.

To avoid collisions on the respective data/command buses or corrupting data in the respective data buffers or the local controllers, the controller 110 may implement timing rules that govern separation timing between memory access commands. The timing may be based on a type of memory access command (e.g., read vs. write) for a current and a previous command, as well as a target partition for each. For example, a separation timing rule for consecutive read commands directed to different partitions may be different than a separation timing rule for a read command to a second partition that follows a write command to a first partition.

By complying with timing separation rules for memory access commands, and including control circuitry in the memory 150 that facilitates multiple concurrent memory access threads, data throughput can be increased as compared with a memory that is only capable of processing a single memory access command at a time.

Figure 2:
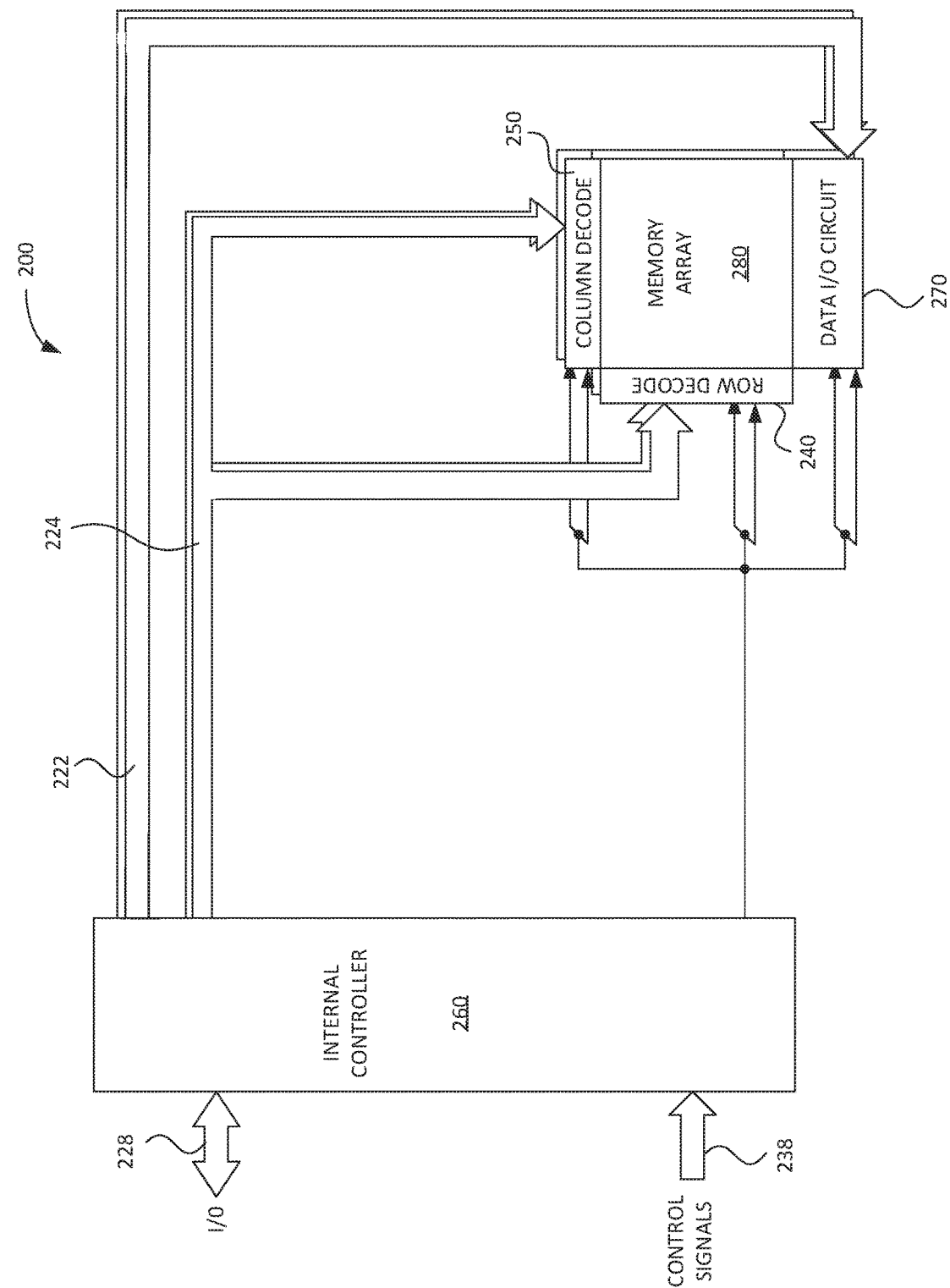
FIG. 2 is a block diagram of memory according to an embodiment of the present disclosure.

FIG. 2 illustrates an apparatus that includes a memory device 200 according to an embodiment of the present invention. The memory device 200 includes a memory array 280 with a plurality of memory cells that are configured to store data. The memory cells may be accessed in the array through the use of various signal lines, word lines (WLs) and/or bit lines (BLs). The memory cells may be non-volatile memory cells, such as NAND or NOR flash cells, phase change memory cells, or may generally be any type of memory cells. The memory cells of the memory array 280 can be arranged in a memory array architecture. For example, in one embodiment, the memory cells are arranged in a 3D cross-point architecture. In other embodiments, other memory array architectures may be used, for example, a single-level cross-point architecture, among others. The memory cells may be single level cells configured to store data for one bit of data. The memory cells may also be multi-level cells configured to store data for more than one bit of data. The memory 200 may be implemented in the memory 150 of FIG. 1. In some examples, the array 280 may be divided into a plurality of partitions.

A data strobe signal DQS may be transmitted through a data strobe bus (not shown). The DQS signal may be used to provide timing information for the transfer of data to the memory device 200 or from the memory device 200. The I/O bus 228 is connected to an internal controller 260 that routes data signals, address information signals, and other signals between the I/O bus 228 and an internal data bus 222 and/or an internal address bus 224. The internal address bus 224 may be provided address information by the internal controller 260. The internal address bus 224 may provide block-row address signals to a row decoder 240 and column address signals to a column decoder 250. The row decoder 240 and column decoder 250 may be used to select blocks of memory cells for memory operations, for example, read and write operations. The row decoder 240 and/or the column decoder 250 may include one or more signal line drivers configured to provide a biasing signal to one or more of the signal lines in the memory array 280. The I/O control circuit 220 include a status register that is configured to store status bits responsive to a read status command provided to the memory device 200. The status bits may have respective values to indicate a status condition of various aspects of the memory and its operation. The internal controller 260 may update the status bits as status conditions change.

The internal controller 260 may also receive a number of control signals 238, either externally or internally to control the operation of the memory device 200. The control signals 238 and the I/O bus 228 may be received on a combined a command, address, and data bus, such as the CAD bus 130 of FIG. 1. The control signals 238 may be implemented with any appropriate interface protocol. For example, the control signals 238 may be pin based, as is common in dynamic random access memory and flash memory (e.g., NAND flash), or op-code based. Example control signals 238 include clock signals, read/write signals, clock enable signals, etc. The internal controller 260 may initiate multiple, concurrent memory access threads to different partitions of the array 280 using the row decoder 240, the column decoder 250, and the data I/O circuit 270, that are capable of independently accessing individual partitions in parallel. For example, the internal controller 260 may sequentially receive memory access commands (e.g., command, address, and/or data information), and may provide (e.g., send) signals to the column decoder 250, the row decoder 240, and the data I/O circuit 270 to initiate execution of the sequentially received memory access commands. In some embodiments, the timing of provision of the signals associated with the memory access commands to the column decoder 250, the row decoder 240, and the data I/O circuit 270 may be based on the type of memory access command and based on whether the target partition is currently executing a memory access command operation.

The internal controller 260 may include a command register store information received by the internal controller 260. The internal controller 260 may be configured to provide internal control signals to various circuits of the memory device 200. For example, responsive to receiving a memory access command (e.g., read, write), the internal controller 260 may provide internal control signals to control various memory access circuits to perform a memory access operation. The various memory access circuits are used during the memory access operation, and may generally include circuits such as row and column decoders, charge pump circuits, signal line drivers, data and cache registers, I/O circuits, as well as others.

The data I/O circuit 270 includes one or more circuits configured to facilitate data transfer between the internal controller 260 and the memory array 280 based on signals received from the internal controller 260. In various embodiments, the data I/O circuit 270 may include one or more registers, buffers, and other circuits for managing data transfer between the memory array 280 and the internal controller 260. In an embodiment, the data I/O circuit 270 may include separate data buffers for each partition of the memory array 280. In an example write operation, the internal controller 260 receives the data to be written through the I/O bus 228 and provides the data to the data I/O circuit 270 via the internal data bus 222. The data I/O circuit 270 writes the data to the memory array 280 based on control signals provided by the internal controller 260 at a location specified by the row decoder 240 and the column decoder 250. During a read operation, the data I/O circuit 270 reads data from the memory array 280 based on control signals provided by the internal controller 260 at an address specified by the row decoder 240 and the column decoder 250. The data I/O circuit 270 provides the read data to the internal controller 260 via the internal data bus 222. The internal controller 260 then provides the read data on the I/O bus 228. In some examples, for each partition of the array 280, the data I/O circuit 270 may include independently controlled data buffers that may be used to independently receive data from or provide data to a respective partition of the array 280.

Figure 3:
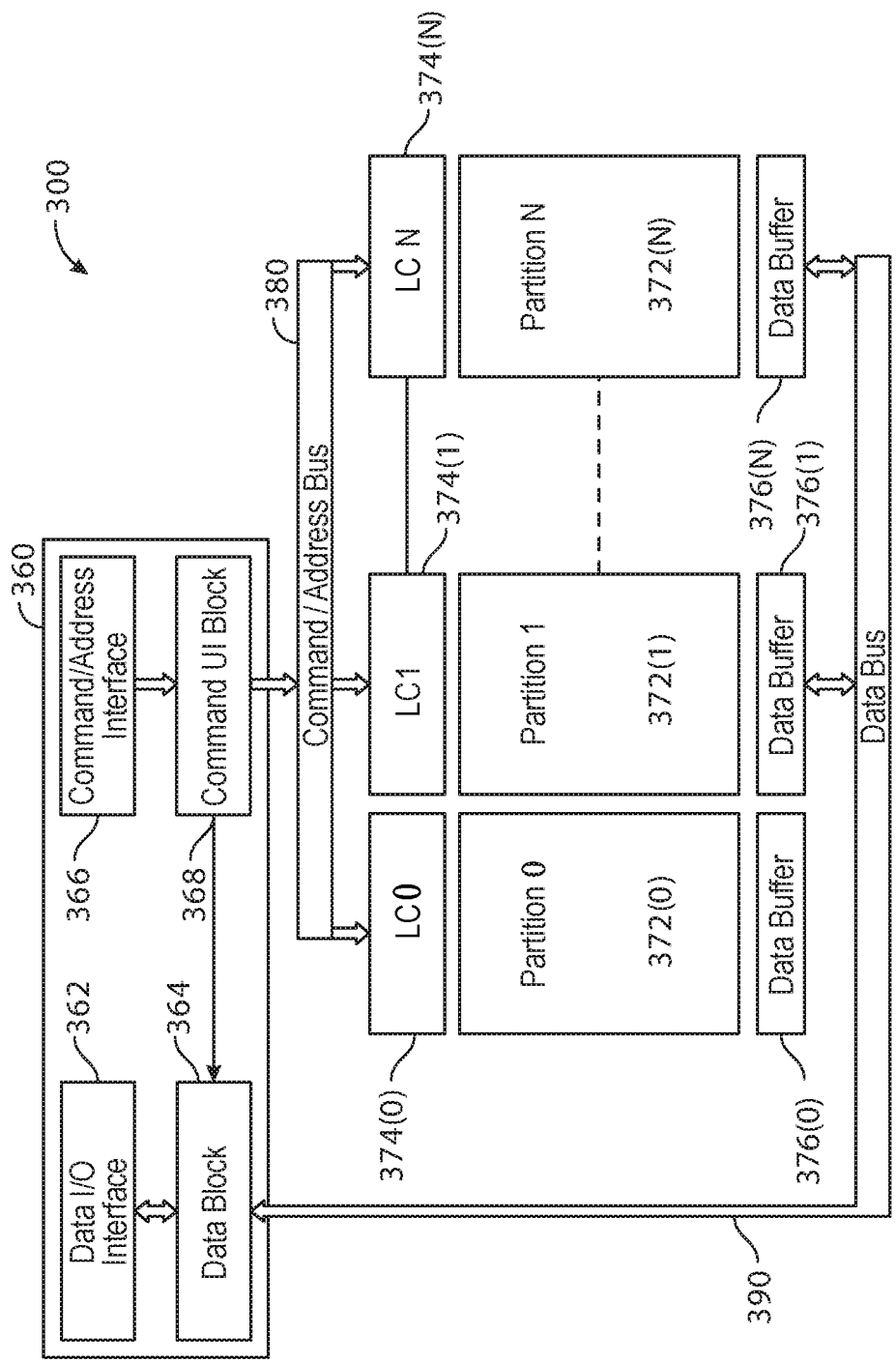
FIG. 3 is a block diagram of memory according to an embodiment of the present disclosure.

FIG. 3 illustrates a portion of a memory 300 configured to concurrently access multiple memory partitions according to an embodiment of the present disclosure. The memory 300 includes an internal controller 360 to process received memory access commands from an external controller (e.g., the controller 110 of FIG. 1) and a memory array including a plurality of partitions 372(0)-372(N). Each of the partitions 372(0)-372(N) may include a respective plurality of memory cells. The partitions 372(0)-372(N) may each be coupled to a respective local controller 374(0)-374(N) and to respective data buffers 376(0)-376(N) to facilitate multi-thread, concurrent access of different partitions 372(0)-372(N). The value of "N" may be a positive, non-zero number. The memory 300 may be implemented in the memory 150 of FIG. 1 and/or the memory 200 of FIG. 2. The memory cells may be non-volatile memory cells, or may generally be any type of memory cells.

The internal controller 360 may include a data I/O interface 362 coupled to a data block 364 and a command/address interface 366 coupled to a command. UI block 368. The data I/O interface 362 may provide data received from the external controller (e.g., responsive to a write access command) to the data block 364, and may provide data received from the data block 364 (e.g., responsive to a read access command) to the external controller. The data block 364 may provide data to (e.g., write memory access) and receive data from (e.g., read memory access) to data buffers 376(0)-376(N) via a data bus 390 responsive to control signals from the command UI block 368.

The command/address interface 366 may provide command and address information received from the external controller to the command UI block 368. The command UI block 368 may determine a target partition of the partitions 372(0)-372(N) and provide the received command and address information to the 374(0)-374(N) associated with the target partition 372(0)-372(N) via a command/address bus 380.

The partitions 372(0)-372(N) may each be independently accessible during memory access operations by the local controllers 374(0)-374(N). For example, during memory access operations, partition 372(0) may be accessed independently of partition 372(1). Each of the partitions 372(0)-372(N) may be coupled to a respective local controller 374(0)-374(N) that is configured to perform the memory access of the respective partition 372(0)-372(N). Each of the local controllers 374(0)-374(N) may include respective sense amplifiers, sequencers (e.g., that access and execute algorithms based on the type of memory access), and driver circuits (e.g., voltage or current driver circuits) to perform memory access operations, such as read accesses or write accesses. The sense amplifiers may be configured to sense data during execution of the memory access command. The sequencers may be configured to execute the algorithm associated with thee memory access command. The driver circuits may be configured to drive voltages along access lines of the partition. Each partition 372(0)-372(N) may also be coupled to a respective data buffer 376(0)-376(N). The data buffers 376(0)-376(N) may be configured to provide data to or receive data from the respective partition 372(0)-372(N). The data buffers 376(0)-376(N) may be controlled by the internal controller 360 or the respective local controllers 374(0)-374(N). Data received from the respective memory partition 372(0)-372(N) may be latched at the data buffers 376(0)-376(N), respectively. The data latched by the respective data buffers 376(0)-376(N) may be provided to the data block 364 via the internal data bus.

In operation, the internal controller 360 may receive a memory access command (e.g., command and address information) via a command and address bus (not shown), and may receive data via a data bus (not shown). The internal controller 360 may determine a respective target partition of the partitions 372(0)-372(N) for each memory access command (e.g., based at least in part on the address information associated with each respective memory access command), and may provide each memory access command to a respective local controller 374(0)-374(N) associated with the target partition. The internal controller 360 may also provide the data to the data buffer 376(0)-376(N) associated with the target partition during a write operation, and may receive data from the data buffers 376(0)-376(N) during a read operation.

More specifically, the command/address interface 366 may receive the command and address information from an external command and address bus, and may provide the received command and address information to the command UI block 368. The command UI block 368 may determine a target partition 372(0)-372(N) and a command type. The command UI block 368 may provide the command and address information to the local controller 374(0)-374(N) via the command and address bus 380 based on the target partition 372(0)-372(N). In some embodiments, the timing of provision of the command and address information to the local controller 374(0)-374(N) may be based on the command type and/or whether the local controller 374(0)-374(N) is currently executing a memory access command. The command UI block 368 may also provide a control signal to the data block 364 based on the command type to instruct the data block 364 to retrieve data from the data I/O interface 362 and provide the data to one of the data buffers 376(0)-376(N) via the data bus (e.g., write access) or to retrieve data from one of the data buffers 376(0)-376(N) via the data bus and provide the retrieved data to the data I/O interface 362 (e.g., read access).

During a write operation, the local controllers 374(0)-374(N) may employ drivers and sequencers to write data from the associated data buffer 376(0)-376(N) to the associated partition 372(0)-372(N).

During a read operation, the local controllers 374(0)-374(N) may employ sense amplifiers, drivers, and sequencers to read data from the associated partition 372(0)-372(N) and latch the data read at the associated data buffer 376(0)-376(N). Each of the local controllers 374(0)-374(N) may be configured to operate independently of each other to access the associated partition 372(0)-372(N). Thus, the individual partitions 372(0)-372(N) may be concurrently accessed without interfering with access of another partition 372(0)-372(N), which may improve throughput and efficiency as compared with a memory that is limited to accessing a single partition at a given time.

As previously discussed, separation timing rules may be used to avoid collisions on the respective data/command buses or corrupting data in the respective data buffers or the local controllers. Correct operation and execution of the memory access commands are managed by complying with the separation timing rules. As further previously discussed, the timing of the separation timing rules may be based on a type of memory access command (e.g., read vs. write) for a current and a previous command, as well as a target partition for each.

FIG. 4 provides a table depicting exemplary timing rules. For example, a Read to Read command to the same partition may have an X1 ns separation rule, and a Read to Read command to different partitions may have an X2 ns separation rule. In a specific example, a first Read command to a first partition is received by the memory and handled accordingly by the local controller associated with the first partition. The soonest a second Read command to the first partition may be provided to the memory is X1 ns. Providing a second Read command to the first partition before X1 ns relative to the first Read command will cause an error in the data read during the operation for the first Read command.

If, however, the second. Read command is to a different partition, the soonest the second Read command to the first partition may be provided to the memory is X2 ns. In contrast, if a first Write command to the first partition is to be provided following the first Read command to the first partition, the soonest the first Write command to the first partition may be provided following the first Read command to the first partition is X5 ns. The time X5 may be different from times X2 and X1. In some embodiments, the time X5 may be equal to X2 and/or X1. The timing variables X1-X8 are exemplary, and are not intended to have a multiple relationship, such as time X2 being twice as long as time X1 or time X8 being eight times as long as time X1. Generally, multiple operations directed to the same partition have longer separation timing than multiple operations directed to different partitions. In some examples, some of the times X1-X8 have the same value and in other embodiments, the times X1-X8 may all be different.

Each separation rule must be met by the controller 110 in order for a memory access command to be received and properly performed by the memory. For example, the controller 110 may send a first read command to a first partition and a second read command to a second partition. Before the controller 110 can send a first write command to the first partition, the timing separation rule for the first read command to the first partition should be met and the timing separation rule for the second read command to the second partition should be met as well before sending the first write command to the first partition. If both timing separation rules are met, the controller may send the first write command to the memory 150. The timing separation rules may be based, for example, on architecture and latency characteristics of the memory 150 for each memory access command type.

From the foregoing it will be appreciated that, although specific embodiments of the disclosure have been described herein for purposes of illustration, various modifications may be made without deviating from the spirit and scope of the disclosure. Accordingly, the disclosure is not limited except as by the appended claims.

What is claimed is:

1. An apparatus, comprising:
a non-volatile memory array comprising a plurality of partitions, wherein each of the plurality of partitions comprises a respective plurality of memory cells;
a plurality of local controllers, wherein each of the plurality of local controllers is configured to independently and concurrently access a respective one of the plurality of partitions to execute a respective memory access command of a plurality of memory access commands responsive to receiving the respective memory access command; and
a controller configured to provide the plurality of memory access commands according to separation timing rules for the memory access commands and to determine a respective target partition of the plurality of partitions for each of the plurality of memory access commands, the controller further configured to provide each of the plurality of memory access commands to a local controller of the plurality of local controllers associated with the respective target partition;
wherein the controller is further configured to send a first memory access command of a first type to a first target partition via a respective local controller associated with the first target partition when:
a memory access command preceding the first memory access command is a second type different from the first type and is sent by the controller to the first target partition via the respective local controller associated with the first target partition, and
at least a first minimum timing between the first memory access command and the memory access command preceding the first memory access command is met;
wherein the controller is further configured to send a second memory access command of the second type to the first target partition via the respective local controller associated with the first target partition when:
a memory access command preceding the second memory access command is the first type and is sent by the controller to the first target partition via the respective local controller associated with the first target partition, and
at least a second minimum timing between the second memory access command and the memory access command preceding the second memory access command is met, wherein the second minimum timing is different from the first minimum timing;
wherein the controller is further configured to send a third write memory access command to a third target partition via a respective local controller associated with the third target partition when:
a write memory access command preceding the third write memory access command is sent by the controller to the third target partition via the respective local controller associated with the third target partition, and
at least a third minimum timing between the third write memory access command and the write memory access command preceding the third write memory access command is met; and
wherein the controller is further configured to send a fourth write memory access command to the third target partition via the respective local controller associated with the third target partition when:
a write memory access command preceding the fourth write memory access command is sent by the controller to a fourth target partition via a respective local controller associated with the fourth target partition, and
at least a fourth minimum timing between the fourth write memory access command and the write memory access command preceding the fourth write memory access command is met, wherein the fourth minimum timing is different from the third minimum timing such that the write memory access command preceding the fourth write memory access command is concurrently being processed at the fourth target partition while the fourth write memory access command is sent to the third target partition.

2. The apparatus of claim 1, wherein a local controller of the plurality of local controller comprises:
respective sense amplifiers configured to sense data during execution of the memory access command;
respective drivers configured to drive voltages along access lines; and
respective sequencers configured to execute an algorithm associated with the memory access command.

3. The apparatus of claim 1, wherein the controller comprises a command and address user interface circuit configured to determine a memory access command type and the respective target partition of the plurality of target partitions for each of the plurality of memory access commands.

4. The apparatus of claim 3, wherein the controller further comprises a command and address interface circuit configured to receive each of the plurality of memory access commands from a memory controller and to provide each of the plurality of memory access commands to the command and address user interface circuit.

5. The apparatus of claim 1, further comprising a plurality of data buffers, wherein each of the plurality of data buffers is configured to independently and concurrently receive data from or provide data to a respective one of the plurality of partitions.

6. The apparatus of claim 1, wherein the controller further comprises a data input/output interface circuit configured to receive write data from a memory controller and to provide the write data to the data block or to receive read data from the data block and to provide the read data to the memory controller.

7. An apparatus, comprising:
a non-volatile memory comprising a plurality of partitions and a plurality of local controllers, wherein each of the plurality of local controllers is configured to independently access a respective one of the plurality of partitions, wherein each of the plurality of partitions comprises a respective plurality of memory cells;
a memory controller configured to provide memory access commands to the non-volatile memory according to separation timing rules for the memory access commands, wherein the memory controller is configured to provide a first memory access command of a first type to a first partition of the plurality of partitions, and provide a second memory access command of second type different from the first type to the first partition of the plurality of partitions immediately after the first memory access command at a minimum of a first time after the first memory access command, and the memory controller is further configured to provide a third memory access command of the second type to a second partition of the plurality of partitions, and provide a fourth memory access command of the first type to the second partition immediately after the third memory access command at a minimum of a second time after the third memory access command is sent, wherein the first time is different from the second time;
wherein the memory controller is further configured to provide a fifth write memory access command to a fifth target partition via a respective local controller associated with the fifth target partition when:
a write memory access command preceding the fifth write memory access command is provided by the memory controller to the fifth target partition via the respective local controller associated with the fifth target partition, and
at least a third time after the write memory access command preceding the fifth write memory access command is passed; and
wherein the controller is further configured to send a sixth write memory access command to the fifth target partition via the respective local controller associated with the fifth target partition when:
a write memory access command preceding the sixth write memory access command is provided by the controller to a sixth target partition via a respective local controller associated with the sixth target partition, and
at least a fourth time after the write memory access command preceding the sixth write memory access command is passed, wherein the fourth time is different from the third time such that the write memory access command preceding the sixth write memory access command is concurrently being processed at the sixth target partition while the sixth write memory access command is provided to the fifth target partition.

8. The apparatus of claim 7, wherein the memory access command of the first type comprises a read memory access command and the memory access command of the second type comprises a write memory access command.

9. The apparatus of claim 7, wherein the non-volatile memory further comprises a plurality of data buffers, wherein a data buffer of the plurality of data buffers is coupled to a respective one of the plurality partitions, wherein the data buffer is configured to latch data from the respective one of the plurality of partitions responsive to a signal from a local controller of the plurality of local controllers coupled to the respective one of the plurality of local controllers.

10. The apparatus of claim 7, wherein the non-volatile memory further comprises a controller configured to receive the memory access commands from the memory controller and determine a respective target partition of the plurality of partitions, the controller further configured to provide the memory access command to a local controller of the plurality of local controllers associated with the target partition.

11. The apparatus of claim 7, wherein the plurality of local controllers of the non-volatile memory are configured to independently access respective ones of the plurality of partitions concurrently.

12. A method, comprising:
receiving a first memory access command and a second memory access command at a controller of a non-volatile memory according to a respective separation timing rule for the first and second memory access commands;
determining a first target partition of the non-volatile memory for the first memory access command and a second target partition of the non-volatile memory for the second memory access command;
providing the first memory access command of a first type to a first local controller of the non-volatile memory coupled to the first target partition;
subsequent to providing the first memory access command to the first local controller, providing a third memory access command of a second type different from the first type to the first local controller of the non-volatile memory coupled to the first target partition when at least a first minimum separation timing between the first memory access command and the third memory access command is met;
subsequent to providing the third memory access command, providing a fourth memory access command of the first type to the first local controller of the non-volatile memory coupled to the first target partition when at least a second minimum separation timing between the third memory access command and the fourth memory access command is met, wherein the second minimum separation timing is different from the first minimum separation timing;
providing a fifth write memory access command to a fifth target partition via a respective local controller associated with the fifth target partition when:
a write memory access command preceding the fifth write memory access command is provided to the fifth target partition via the respective local controller associated with the fifth target partition, and at least a third minimum separation timing between the fifth write memory access command and the write memory access command preceding the fifth write memory access command is met; and providing a sixth write memory access command to the fifth target partition via the respective local controller associated with the fifth target partition when:
  a write memory access command preceding the sixth write memory access command is provided to a sixth target partition via a respective local controller associated with the sixth target partition, and
  at least a fourth minimum separation timing between the sixth write memory access command and the write memory access command preceding the sixth write memory access command is met, wherein the fourth minimum separation timing is different from the third minimum separation timing such that the write memory access command preceding the sixth write memory access command is concurrently being processed at the sixth target partition while the sixth write memory access command is provided to the fifth target partition.

13. The method of claim 12, wherein the first memory access command is a write command, the method further comprising:
  receiving write data at the controller; and
  providing the write data to a first data buffer of the non-volatile memory via a data bus, wherein the first data buffer is coupled to the first target partition, wherein executing the first memory access command comprises writing the write data to the first target partition.

14. The method of claim 13, wherein the second memory access command is a read command, wherein executing the second memory access command comprises latching read data from the second partition at a second data buffer of the non-volatile memory coupled to the second target partition.

15. The method of claim 12, further comprising prior to providing the first memory access command to the first local controller, determining whether the first local controller has finished executing a previous memory access command.

16. The method of claim 12, wherein determining the first target partition of the non-volatile memory for the first memory access command is based on an address of the first memory access command.

17. A method, comprising:
  providing a first memory access command to a non-volatile memory;
  determining whether time elapsed since providing the first memory access command satisfies a separation timing rule associated with a second memory access command and the first memory access command;
  responsive to the separation timing rule being met, providing the second memory access command to the non-volatile memory;
  providing a third memory access command of a first type to the non-volatile memory to access the first target partition;
  determining whether time elapsed since providing the third memory access command satisfies a first minimum separation timing based on a fourth memory access command of a second type different from the first type to access the first target partition subsequent to the third memory access command;
  responsive to the first minimum separation timing being met, providing the fourth memory access command to the non-volatile memory;
  providing a fifth memory access command of the second type to the non-volatile memory to access the first target partition;
  determining whether time elapsed since providing the fifth memory access command satisfies a second minimum separation timing based on a sixth memory access command of the first type to access the first target partition subsequent to the fifth memory access command;
  responsive to the second minimum separation timing being met, providing the sixth memory access command to the non-volatile memory, wherein the first minimum separation timing is different from the second minimum separation timing;
  providing a seventh write memory access command to a seventh target partition via a respective local controller associated with the seventh target partition when:
    a write memory access command preceding the seventh write memory access command is provided to the seventh target partition via the respective local controller associated with the seventh target partition, and
    at least a third minimum separation timing between the seventh write memory access command and the write memory access command preceding the seventh write memory access command is met; and
  providing an eighth write memory access command to the seventh target partition via the respective local controller associated with the seventh target partition when:
    a write memory access command preceding the eighth write memory access command is provided to an eighth target partition via a respective local controller associated with the eighth target partition, and
    at least a fourth separation timing between the eighth write memory access command and the write memory access command preceding the eighth write memory access command is met, wherein the fourth separation timing is different from the third separation timing such that the write memory access command preceding the eighth write memory access command is concurrently being processed at the eighth target partition while the eighth write memory access command is provided to the seventh target partition.

18. The method of claim 17, wherein the first target partition and the second target partition are the same partition.

19. The method of claim 17, further comprising determining a first command type associated with the first memory access command and a second command type associated with the second memory access command, wherein the separation timing rule is further based on the first command type and the second command type.

20. The method of claim 17, further comprising concurrently executing the first memory access command at the first target partition and the second memory access command at the second target partition.

21. The apparatus of claim 1, wherein the controller is configured to consecutively send a first read memory access command to the first target partition and a second read memory access command to the second target partition, and to send a first write memory access command subsequent to the first and second read memory access commands when a third minimum timing between the first read memory access command and the first write memory access command is met, and when a fourth minimum timing between the second read memory access command and the first write memory access command is also met.

22. The apparatus of claim 7, wherein the memory controller is further configured to provide consecutive fifth and sixth memory access commands of the first type to the first and second partition of the plurality of partitions, respectively, and to provide a seventh memory access command of the second type at a minimum of a third time after providing the fifth memory access command and also at a minimum of a fourth time after providing the sixth memory access command.

23. The method of claim 12 further comprising:
providing consecutive first and second read memory access commands to the first local controller of the non-volatile memory coupled to the first target partition and to the second local controller of the non-volatile memory coupled to the second target partition, respectively;
subsequent to providing the first and second read memory access commands, providing a first write memory access command to the non-volatile memory when at least a third minimum separation timing between the first read memory access command and the first write memory access command is met, and when at least a fourth minimum separation timing between the second read memory access command and the first write memory access command is also met.

24. The method of claim 18 further comprising:
providing consecutive seventh and eighth memory access commands of the first type to the non-volatile memory to access the first target partition and the second target partition, respectively;
determining whether time elapsed since providing the seventh memory access command satisfies a third minimum separation timing based on a ninth memory access command of the second type subsequent to the seventh memory access commands;
determining whether time elapsed since providing the eighth memory access command satisfies a fourth minimum separation timing based on the ninth memory access command of the second type subsequent to the eighth memory access commands;
responsive to the third and fourth minimum separation timings being met, providing the ninth memory access command to the non-volatile memory.

* * * * *